United States Patent
Nagai

[11] Patent Number: 5,935,265
[45] Date of Patent: Aug. 10, 1999

[54] SCAN PATH CIRCUIT PERMITTING TRANSITION BETWEEN FIRST AND SECOND SETS OF CHECK DATA

[75] Inventor: Hajime Nagai, Tokyo, Japan

[73] Assignee: U.S. Philips Corporation, New York, N.Y.

[21] Appl. No.: 08/982,882

[22] Filed: Dec. 2, 1997

[30] Foreign Application Priority Data

Dec. 4, 1996 [JP] Japan ................................. 8-338905

[51] Int. Cl.$^6$ ................................................ G01R 31/28
[52] U.S. Cl. ........................................................ 714/724
[58] Field of Search ........................... 371/22.31, 22.32, 371/22.34, 22.36, 22.5, 22.6, 22.1; 324/158.1

[56] References Cited

U.S. PATENT DOCUMENTS 4,225,958  9/1980  Funatsu ................................. 371/22.1

FOREIGN PATENT DOCUMENTS 0 212 268  3/1987  European Pat. Off. .

Primary Examiner—Hoa T. Nguyen
Attorney, Agent, or Firm—Brian J. Wieghaus

[57] ABSTRACT

Logical device comprises a combinational circuit and a sequential circuit. The sequential circuit has a holding means which is between the combinational circuit and flip-flops of the sequential circuit. The output data of the holding means are not changed until a control signal is applied to a control terminal. The performance of the combinational circuit in the logical device can be checked.

2 Claims, 5 Drawing Sheets

SCAN PATH CIRCUIT PERMITTING TRANSITION BETWEEN FIRST AND SECOND SETS OF CHECK DATA

BACKGROUND OF THE INVENTION

The present invention relates to a logical device comprising a combinational circuit and a sequential circuit for holding output data of the combinational circuit, the sequential circuit comprising an input portion for receiving output data from the combinational circuit, an output portion for supplying output data of the sequential circuit to the combinational circuit, a check data input terminal for sequentially receiving test data and a check data output terminal for reading out output data of the combinational circuit. The present invention also relates to a method for testing such a logical device.

A combinational circuit can be tested by applying test data to its inputs and checking the output data that is generated at its outputs. It is more difficult to test a combinational circuit in a logical device as defined in the preamble, because the outputs of the combinational circuit also depend on a status of the sequential circuit, i.e. on a status of flip-flops contained therein.

As one example of a testing method that effectively deals with the sequential circuit, the Japanese Patent Application Laid-open No. 76037/79 discloses a logical device in which the flip-flops are chained to each other to form so-called scan paths, i.e. shift registers. The conventional device comprises a check data input terminal through which the shift registers sequentially receive a plurality of bits of check data and a check data output terminal from which the tested check data from the shift register are sequentially read out.

However, the conventional device does not enable transition testing from first check data to second check data. In the conventional device, the status of the combinational circuit may be changed during sequentially receiving a plurality of check data in the shift registers.

Furthermore, in the conventional device it is not possible to check a delay time of the output signal of the combinational circuit, in response to a transition of the check data. The delay time depends on the status of the combinational circuit. Assume, for example, that the combinational circuit is an adder and the previous output data of the adder are "1111". When the adder is incremented by adding "0001", the output data of the adder will be "0000". As another example, assume that the previous output data of the adder are "1110". When the adder is incremented by adding "0001", the output data of the adder will be "1111". The delay time in case of the previous output data "1111" may be different from the delay time in case of the previous output data "1110" because of the carry generation. In the conventional device, since it is not possible to establish a transition from first check data to second check data, the delay time in response to the other check data can not be measured.

SUMMARY OF THE INVENTION

It is, inter alia, an object of the invention to provide a logical device of which a performance of the combinational circuit can be checked and a delay time of output signals of the combinational circuit can be measured, in case of the transition from the desired check data to the other desired check data. To this end, the logical device in accordance with the invention is characterized in that the output portion of the sequential circuit comprises a holding means for, during a period of sequentially receiving the check data, holding the output data of the sequential circuit.

During a period of sequentially receiving the check data, the output data from the combinational circuit are not changed, as the output data from the sequential circuit remain the same as just before the sequential circuit starts receiving the check data. So, the status of the combinational circuit is not changed until the period of sequentially receiving the check data is completed. After the period of sequentially receiving the check data is completed, the desired check data are supplied from the sequential circuit to the combinational circuit. Thus, the transition from the desired check data to the other desired check data can be checked.

According to another aspect of the invention, the logical device is characterized in that the input portion of the sequential circuit comprises a preventing means for preventing that the output data of the combinational circuit are read by the input portion of the sequential circuit, and a holding means for holding the output data of the combinational circuit just before preventing that the output data of the combinational circuit are read out, the output portion of the sequential circuit comprising a preventing means for preventing from supplying the output data of the sequential circuit to the combinational circuit.

During a period of sequentially receiving the check data, the preventing means in the output portion of the sequential circuit prevents the sequential circuit from supplying the check data to the combinational circuit. When the prevention is canceled after sequentially receiving the check data is completed, the combinational circuit receives the check data, and output data of the combinational circuit, which depend on the check data, are applied to the input portion of the sequential circuit. After the prevention in the output portion is canceled, the preventing means in the input portion of the sequential circuit prevents the input portion of the sequential circuit from reading out output data of the combinational circuit. Now, a measuring time is defined as the transition time from an instant in canceling the prevention of the check data by the preventing means in the output portion of the sequential circuit to an instant in preventing the input portion of the sequential circuit from reading out the output data of the combinational circuit by the preventing means in the input portion. When the measuring time is short, the output data of the combinational circuit, which depend on the check data, may not be held by the holding means. When the measuring time becomes longer, the data held by the holding means may be equal to the expected value. This measuring time represents the delay time of the output signals of the combinational circuit.

A method for checking the combinational circuit in the logical device according to the invention comprises the following steps:

a) preventing the output portion of the sequential circuit from supplying the check data to the combinational circuit by the preventing means in the output portion, during a period of sequentially receiving the check data from the check data input terminal, b) after sequentially receiving the check data is completed, supplying the check data in the sequential circuit to the combinational circuit by the termination of the prevention, and c) after terminating the prevention, preventing the input portion of the sequential circuit from reading out the output data of the combinational circuit by the preventing means in the input portion.

BRIEF DESCRIPTION OF THE DRAWINGS

The invention will hereinafter be described in greater detail with reference to the drawings in which.

DESCRIPTION OF THE PREFERRED EMBODIMENTS

Figure 1:
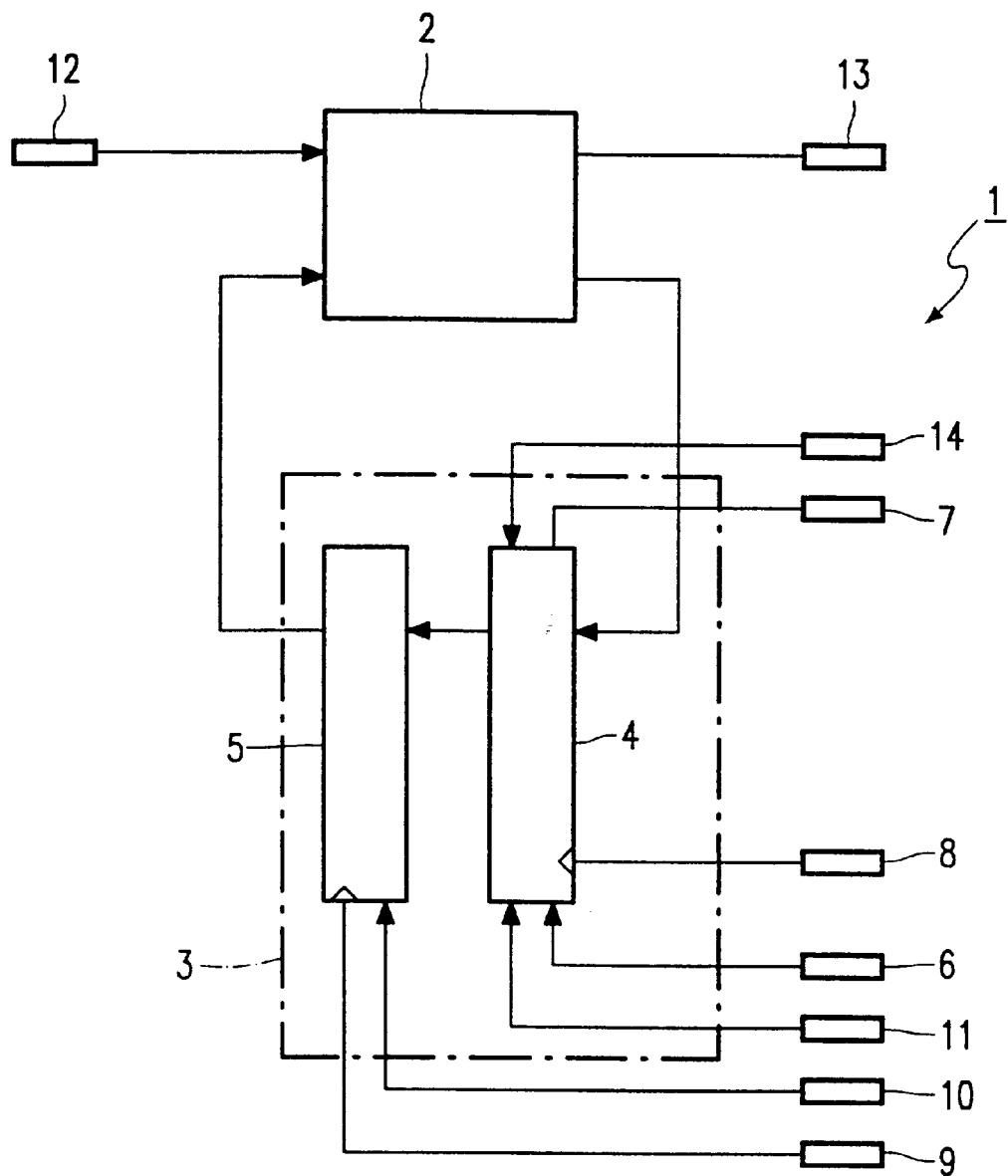
FIG. 1 shows a block diagram of a logical device according to the invention.

FIG. 1 shows a block diagram of a logical device according to the invention. The logical device 1 comprises a combinational circuit 2 and a sequential circuit 3. The sequential circuit 3 comprises a flip-flop portion 4 including an input portion coupled to the combinational circuit 2, and a latch circuit 5 including an input portion coupled to the flip-flop portion 4 and an output portion coupled to the combinational circuit 2. The flip-flop portion 4 comprises a check data input terminal 6 for sequentially receiving the check data, a check data output terminal 7 for reading out output data of the combinational circuit 2, a clock input terminal 8 for receiving a clock signal ck1, a control terminal 11 for receiving a control signal ctrA to switch between a normal mode and a test mode, and a control terminal 14 for receiving a control signal ctrC to read out the output data of the combinational circuit 2 from the check data output terminal 7. The latch circuit 5 comprises a clock input terminal 9 for receiving a clock signal ck2 to latch data of the flip-flop portion 4, and a control terminal 10 for receiving a control signal ctrB to select output data of the latch circuit 5 depending on the clock signal ck2 or independent of the clock signal ck2. The combinational circuit 2 comprises another input terminal 12 for receiving signals from other circuits (not shown), and another output terminal 13 for supplying signals to the other circuits (not shown).

In a normal mode of the logical device 1, the control signals ctrA and ctrB are, for example, low level. The combinational circuit 2 receives signals from input terminal 12 and from the sequential circuit 3. At the same time, the combinational circuit 2 supplies output signals to the input portion of the flip-flop portion 4 and to output terminal 13. The sequential circuit 3 holds the output signals of the combinational circuit 2 under control of the clock signal ck1. So, latch circuit 5 controls the signals that are applied to the input portion of the combinational circuit 2.

The operation of the logical device 1 in a test mode of the combinational circuit 2 will be explained hereinafter. In the test mode, the control signals ctrA and ctrB are, for example, high level. The flip-flop portion 4 acts as a shift register. Since the control signal ctrB is high, latch circuit 5 keeps the previous output signals until a clock signal ck2 is applied to the clock input terminal 9. The clock signal ck1 is applied to the clock input terminal 8. The check data scA are sequentially applied to a check data input terminal 6 by the clock signal ck1. When the flip-flop portion 4 has received all the check data scA, the clock signal ck2 is applied to the clock input terminal 9 of the latch circuit 5. Thus, the check data scA are applied to the input portion of the combinational circuit 2. Depending on the check data scA, the output signals of the combinational circuit 2 are changed, while the output signals of the combinational circuit 2 do not affect the sequential circuit 3.

The process is repeated for check data scA'. The check data scA' are sequentially applied to the check data input terminal 6 by the clock signal ck1. When the flip-flop portion 4 has received all the check data scA', the clock signal ck2 is applied to the clock input terminal 9 of the latch circuit 5 again. Thus, the check data scA' are applied to the input portion of the combinational circuit 2. Depending on the check data scA', the output data of the combinational circuit 2 are changed. Subsequently, the control signal ctrA applied to the control terminal 11 of the flip-flop portion 4 is changed to a low level. The control signal ctrC is applied to the control terminal 14 for enabling that the output data from the combinational circuit is read out. Then, the output data of the combinational circuit 2 are sequentially read out from the output terminal 7 under control of the clock signal ck1.

In the above-mentioned way, the response of the combinational circuit to the transition from the check data scA to scA' can be checked by checking the output data from the output terminal 7. While the flip-flop portion 4 sequentially receives the check data, the output data of the latch circuit 5 are not changed as long as the clock signal ck2 is not applied to the latch circuit 5, because the latch circuit 5 then holds the data it received just before the check data are sequentially applied to the flip-flop portion 4.

Figure 2:
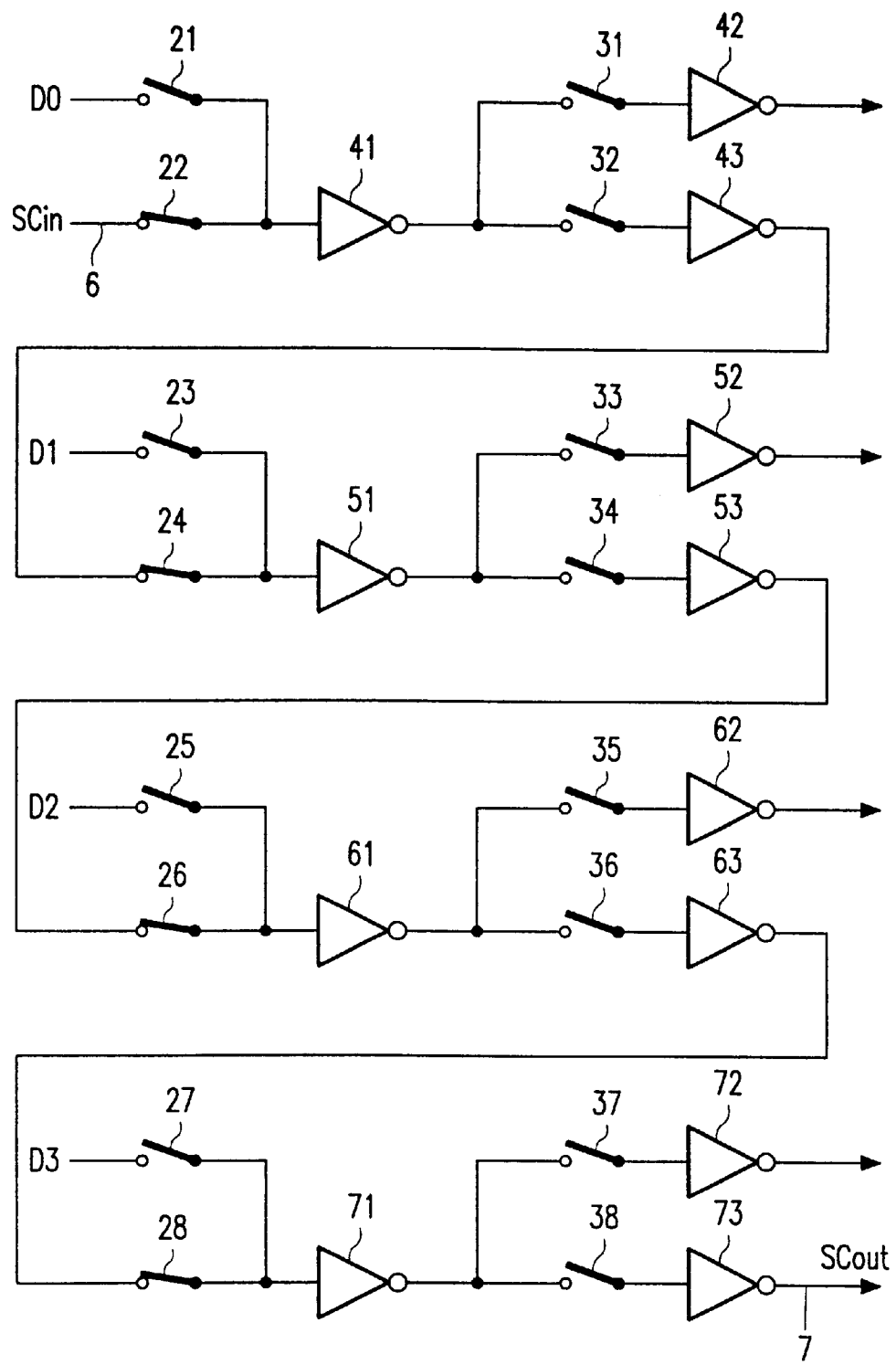
FIG. 2 shows a circuit diagram of a sequential circuit according to a first embodiment of the invention.

FIG. 2 shows a sequential circuit according to a first embodiment of the invention. In this embodiment, the flip-flop portion 4 and the latch circuit 5 of FIG. 1 are combined. The number of data bits received in parallel from the combinational circuit 2 by the sequential circuit 3 is four, and the sequential circuit comprises four stages. The four input terminals of the sequential circuit 3 for receiving the data from the combinational circuit 2 are connected with terminals of switches 21, 23, 25 and 27, respectively. The check data input terminal 6 is connected with a terminal of a switch 22. The switches 24, 26 and 28 are connected with output portions of the inverting circuits 43, 53 and 63, respectively. The input portions of inverting circuits 41, 51, 61 and 71 are connected with the other terminals of switches 21 to 28. The output terminals thereof are connected with the terminals of switches 31 to 38. Input portions of the inverting circuits 42, 52, 62 and 72 are connected with the other terminals of switches 31, 33, 35 and 37, respectively. Output portions of the inverting circuits 42, 52, 62 and 72 are connected with the input portions of the combinational circuit 2. An output portion of the inverting circuit 73 is connected with the check data output terminal 7. These switches are closed when the control signal for controlling the switches is low. The control signal for the switches 21, 23, 25 and 27 is referred to as ctr1. The control signal for the switches 22, 24, 26 and 28 is referred to as ctr2. The control signal for the switches 31, 33, 35 and 37 is referred to as ctr3. The control signal for the switches 32, 34, 36 arid 38 is referred to as ctr4.

In a normal mode, the control signal ctrl is low, and the control signals ctr2 and ctr4 are high. The input data D0 to D3 applied to the flip-flop portion 4 are applied to the terminals of the switches 21, 22, 23 and 24, respectively. The data D0 to D3 are passed on by these switches and are inverted by the inverting circuits 41, 51, 61 and 71. In response to the control signal ctr3, the switches 31, 33, 35 and 37 are opened or closed. They pass on the inverted data to the inverting circuits 42, 52, 62 and 72, after which they are applied as output signals of the sequential circuit 3 to the combinational circuit 2. The input portions of the inverting circuits 42, 52, 62 and 72 comprise floating capacitor elements. These floating capacitor elements play a role as holding means for holding the data. Thus, when the switches 31, 33, 35 and 37 are opened, the data are statically held by the inverting circuits 42, 52, 62 and 72. These switches and inverting circuits play a role as flip-flops.

Figure 3:
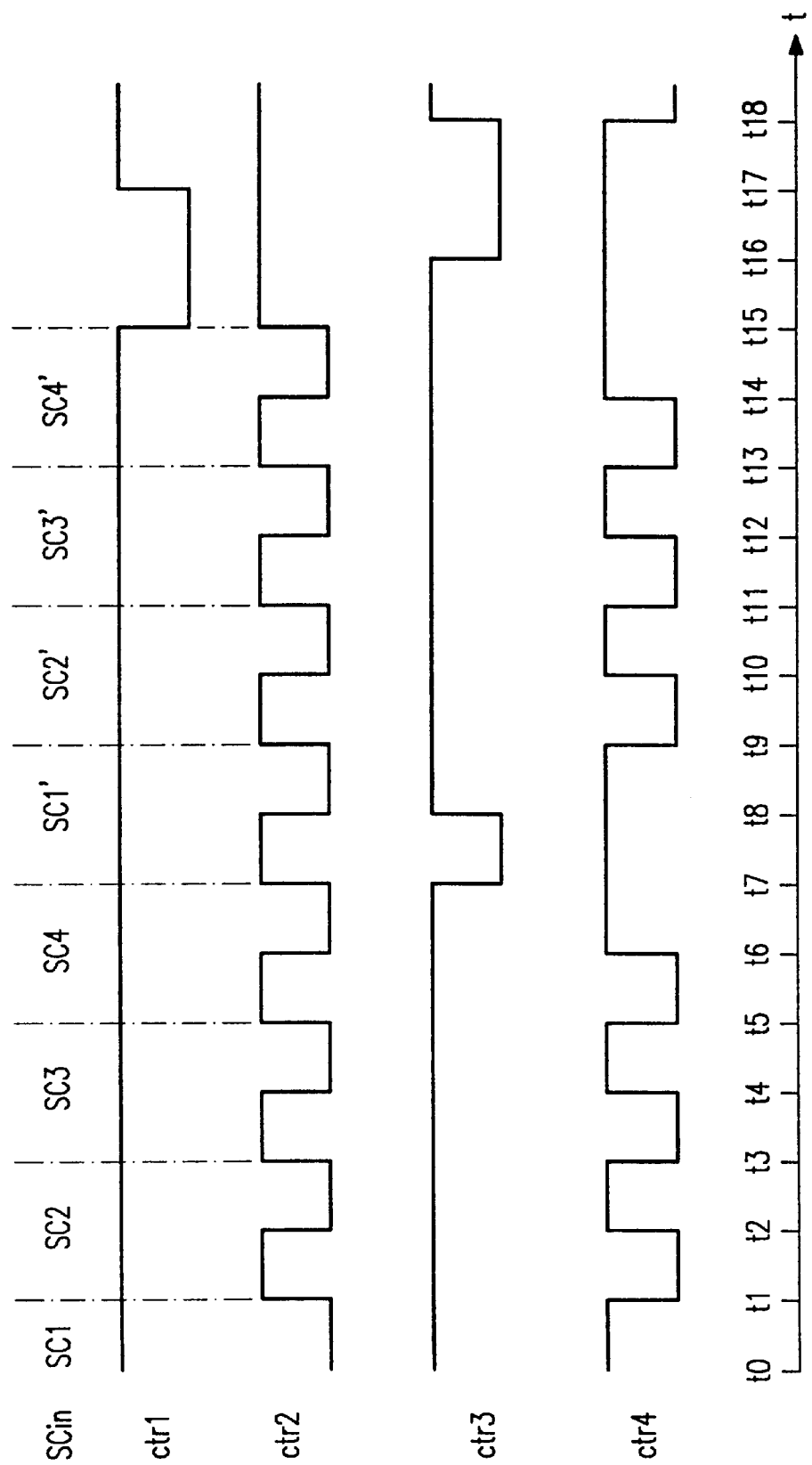
FIG. 3 shows a timing chart of control signals for supplying the check data to the sequential circuit of the FIG. 2.

FIG. 3 shows a timing chart of the control signals ctr1 to ctr4 and the serial 4 bits of check data SCin (sc1, sc2, sc3, sc4) applied to the check data input terminal 6. During a period between t0 and t1, the control signal ctr1 is high, the switches 21, 23, 25 and 27 are opened, the control signal ctr2 is low, and the switches 22, 24, 26 and 28 are closed. The check data sc1 is applied to the input portion of the inverting circuit 41 via the switch 22. Since the control signals ctr3 and ctr4 are high, the switches 31 and 32 are opened. The floating capacitor element in the input portion of the inverting circuit 42 plays a role as data holding means and holds the previous data of the inverting circuit 42 just before the switch 31 is opened. During a period between t1 and t2, the control signal ctr1 is still high, the control signal ctr2 is also high, so the switches 21 and 22 are opened. Since the control signal ctr4 is changed to a low level, the switch 32 is closed, and the inverted check data sc1, which are output data of the inverting circuits 41, are applied to the input portion of the inverting circuit 43 via the switch 32. In the same way, the check data sc2, sc3, sc4 are sequentially applied to the check data input terminal 6. Consequently, during a period between t6 and t7, the output portions of the inverting circuits 41, 51, 61 and 71 have the output data of the inverted check data sc4, sc3, sc2 and sc1.

During a period between t7 and t8, the control signal ctr4 is high, the switches 32, 34, 36 and 38 are opened, the control signal ctr3 is changed to a low level, and the switches 31, 33, 35 and 37 are closed. The inverted check data sc1, sc2, sc3 and sc4 are further inverted by the inverting circuits 42, 52, 62 and 72, and are applied to the input portion of the combinational circuit 2 as the output signals of the sequential circuit 3. It should be noted that during a period between t0 and t7, the output signals of the sequential circuit 3 are not changed because the control signal ctr3 is high.

In the same way, during a period between t8 and t15, the serial 4 bits of the other check data sc1', sc2', sc3' and sc4' are applied to the check data input terminal 6. During a period between t15 and t16, the control signal ctr1 is low, the switches 21, 23, 25 and 27 are closed. During a period between t16 and t17, the control signal ctr3 is low, the switches 31, 33, 35 and 37 are closed, and these check data are applied to the input portion of the combinational circuit 2 as the output signals of the sequential circuit 3. In addition, the output data of the combinational circuit 2 are applied to the inverting circuits 41, 51, 61 and 71 via the switches 21, 23, 25 and 27, respectively. During a period between t17 and t18, the control signal ctrl is high, the switches 21, 23, 25 and 27 are opened. The output data D0 to D3 of the combinational circuit 2 are statically held by the inverting circuit 41, 51, 61 and 71. It should be noted that during a period between t8 and t16 the control signal ctr3 is high, so the output signals of the sequential circuit 3 are the previous check data, i.e., sc1, sc2, sc3 and s4. Therefore, the combinational circuit 2, in case of a transition from the previous check data sc1, sc2, sc3 and sc4 to the other check data sc1', sc2', sc3' and sc4', can be checked.

Figure 4:
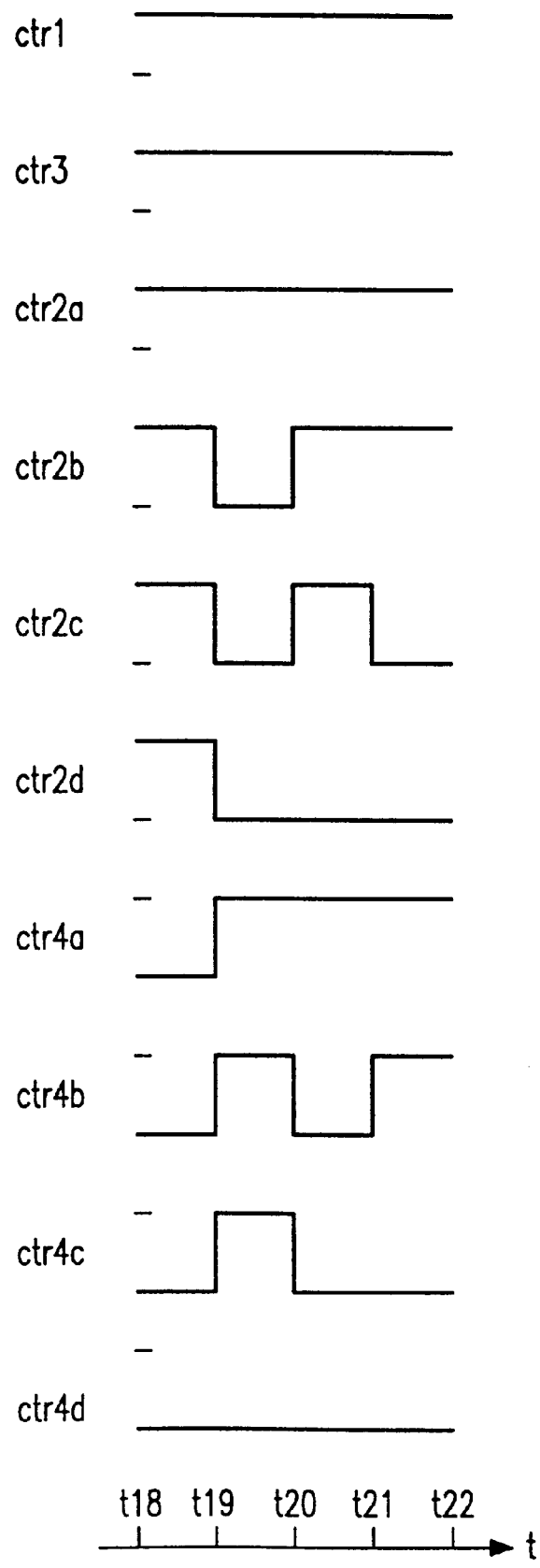
FIG. 4 shows a liming chart of control signals for reading out the data from the sequential circuit of FIG. 2.

FIG. 4 shows a timing chart of the control signals controlling the reading out of the output signals D0 to D3 of the combinational circuit 2 through the check data output terminal 7. The control signals for the switches 22, 24, 26 and 28 are expressed as ctr2a, ctr2b, ctr2c and ctr2d, respectively. In the same way, the control signals for the switches 32, 34, 36 and 38 are expressed as ctr4a, ctr4b, ctr4c and ctr4d. The control signal ctr1 is high after t17. So the switches 21, 23, 25 and 27 are opened. In the same way, the control signal ctr3 is high after t18. So the switches 31, 33, 35 and 37 are opened. During a period between t18 and t19, the control signals ctr2a, ctr2b, ctr2c and ctr2d are high, and the switches 22, 24, 26 and 28 are opened, while the control signals ctr4a, ctr4b, ctr4c and ctr4d are low, therefore, the output data D3 is read out from the check data output terminal 7 via the inverting circuit 71, the switch 38 and the inverting circuit 73. The output data D2 is applied to the input terminal of the switch 28 via the inverting circuit 61, the switch 36 and the inverting circuit 63. The output data D1 is applied to the input terminal of the switch 26 via the inverting circuit 51, the switch 34 and the inverting circuit 53. The output data D0 is applied to the input terminal of the switch 24 via the inverting circuit 41, the switch 32 and the inverting circuit 43. Subsequently, according to the timing chart of FIG. 4, the output data D0, D1, D2 and D3 are sequentially read out from the check data output terminal 7. Based on the output data D0, D1, D2 and D3, the performance of the combinational circuit 2 can be checked.

During a period between t15 and t17, the switches 21, 23, 25 and 27 are closed. At the time t16, the control signal ctr3 becomes low, the check data sc1', sc2', sc3' and sc4' are applied to the combinational circuit 2. The output signals of the combinational circuit 2 in a response to these check data should be applied to the input portions of the inverting circuits 41, 51, 61 and 71 before the control signal ctr1 is high, i.e., before t17. The measure time is defined as the time between t16 and t17. First, the measure time is set as a very short period. When a delay time of the output data of the combinational circuit 2 is longer than the measure time, the read out output data are not correct. Then the measure time is set to be expanded gradually. A certain measure time in which the expected output data D0 to D3 can be read out correctly is equal to the delay time of the output data of the combinational circuit 2.

In the embodiment in FIG. 2, after the switches are opened, the input portions of the inverting circuits are in the opening status, i.e. high impedance status. The switches should be dynamically switched in order to prevent a loss of voltages which are applied to the input portions of the inverting circuits just before the switches are opened.

Figure 5:
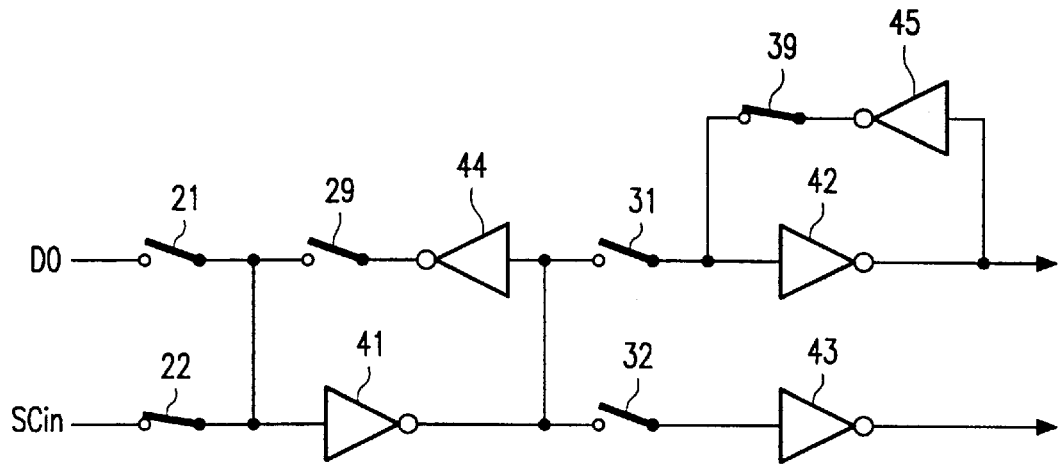
FIG. 5 shows a circuit diagram of a sequential circuit according to a second embodiment of the invention.

FIG. 5 shows a circuit diagram of a sequential circuit according to a second embodiment of the invention. Only a single stage of the sequential circuit is given. Like in FIG. 2, when 4 data bits in parallel are provided to the sequential circuit by the combinational cirucit, four such stages will be used. The output terminal of the inverting circuit 41 is coupled to the input portion of the inverting circuit 41 via the inverting circuit 44 and the switch 29. In the same way, the output portion of the inverting circuit 42 is coupled to the input portion of the inverting circuit 42 via the inverting circuit 45 and the switch 39. When the switches 21 and 22 are opened, the switch 29 is closed. It is advantageous that due to the holding means, such as a combination of the switch 29 with the inverting circuit 44, the input terminal of the inverting circuit 41 is not in a floating status. The switch 39 and the inverting circuit 45 also have the same advantage.

Figure 6:
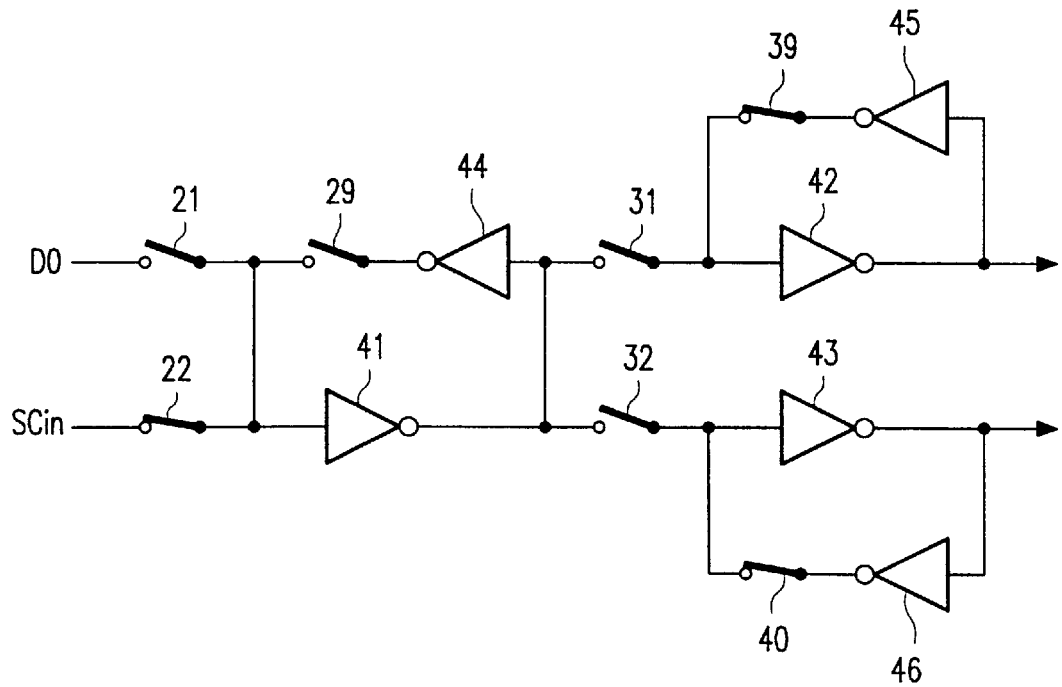
FIG. 6 shows a circuit diagram of a sequential circuit according to a third embodiment of the invention.

FIG. 6 shows a sequential circuit according to a third embodiment of the invention. Like in FIG. 5, only a single stage is shown. In this embodiment, the output portion of the inverting circuit 43 is coupled to the input portion of the inverting circuit 43 via the inverting circuit 46 and the switch 40. When the switch 32 is opened, the switch 40 is closed. It is advantageous that the holding means, such as a combination of the switch 40 with the inverting circuit 46, prevent the input portion of the inverting circuit 43 from being in the floating status.

The inverting circuit 43 is only used for the test mode, so the switches 22 and 32 can be opened and closed very quickly. On the other hand, the inverting circuits 41 and 42 are used for both the test mode and the normal mode. The opening periods of the switches 21 and 31 depend on a circumstance in the normal mode. Therefore, the second embodiment shown in FIG. 5 is very practical in size and cost.

The sequential circuit including the holding means such as latch circuits can check a performance of the combinational circuit in case of the transition from the desired data to the other desired data applied to the combinational circuit.

By adjusting the measure time, the delay time of the combinational circuit can be measured. Generally, the delay time of the combinational circuit depends on the input signal and the subsequent input signal applied to the combinational circuit. If the check data as the input signal and the other check data as the subsequent input signal can be selected, the maximum of the delay time of the output data of the combinational circuit can be measured.

Since the logical device according to the invention comprises the inverting circuits and the switches, the logical device has a small size and a small power consumption. It will be recognized that instead of the inverting circuits, non-inverting circuits also have the same advantage.

In the embodiments, the inputs and the outputs of the sequential circuit are coupled to the outputs and the inputs of the same combinational circuit, respectively. It is also within the scope of the invention that the outputs of the sequential circuit are coupled to the inputs of the other combinational circuits. It will give the same advantages.

I claim:

1. A logical device comprising:

a combinational circuit which produces output data and a sequential circuit coupled to the combinational circuit, which holds output data of the combinational circuit and which produces output data of the sequential circuit, the sequential circuit comprising an input portion for receiving the output data from the combinational circuit, an output portion for supplying the output data of the sequential circuit to the combinational circuit, a check data input terminal for sequentially receiving check data and a check data output terminal for reading out output data of the combinational circuit, the input portion of the sequential circuit including a preventing circuit which prevents the input portion of the sequential circuit from reading out the output data of the combinational circuit and a holding circuit which holds the output data of the combinational circuit just before the prevention.

2. A method for testing a combinational circuit in a logical device comprising a combinational circuit and a sequential circuit for holding output data of the combinational circuit, the sequential circuit comprising an input portion and an output portion, said method comprising the following steps:

a) preventing the output portion of the sequential circuit from supplying check data to the combinational circuit during a period of sequentially receiving the check data from a check data input terminal in the input portion, b) after sequentially receiving the check data is completed, supplying the check data of the sequential circuit to the combinational circuit by the termination of the prevention, and c) after terminating the prevention, preventing the input portion of the sequential circuit from reading out the output data of the combinational circuit by the preventing means in the input portion.

* * * * *